US010454194B1

(12) United States Patent
Phillips et al.

(10) Patent No.: US 10,454,194 B1
(45) Date of Patent: Oct. 22, 2019

(54) CARD EDGE CONNECTOR ASSEMBLY

(71) Applicant: TE CONNECTIVITY CORPORATION, Berwyn, PA (US)

(72) Inventors: Michael John Phillips, Camp Hill, PA (US); Charles Jameson Valentine, Lancaster, PA (US); Nitish Balakrishnan, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/221,745

(22) Filed: Dec. 17, 2018

(51) Int. Cl.
*H01R 13/629* (2006.01)
*H01R 12/72* (2011.01)
*H01R 13/514* (2006.01)
*H05K 1/11* (2006.01)
*H01R 24/62* (2011.01)
*H01R 107/00* (2006.01)
*H01R 12/70* (2011.01)

(52) U.S. Cl.
CPC ......... *H01R 12/721* (2013.01); *H01R 13/514* (2013.01); *H01R 13/629* (2013.01); *H01R 24/62* (2013.01); *H05K 1/117* (2013.01); *H01R 12/7005* (2013.01); *H01R 12/7029* (2013.01); *H01R 2107/00* (2013.01); *H05K 2201/09145* (2013.01)

(58) Field of Classification Search
None
See application file for complete search history.

(56) References Cited

U.S. PATENT DOCUMENTS

| | | | | |
|---|---|---|---|---|
| 6,350,143 B2* | 2/2002 | Kato | ................... | H01R 13/743 439/297 |
| 8,152,562 B2* | 4/2012 | Gross | ................... | H01R 13/748 439/374 |
| 8,425,250 B2* | 4/2013 | Kagotani | ............... | H01R 13/60 439/374 |
| 9,397,442 B2 | 7/2016 | Sutter et al. | | |
| 10,236,605 B1* | 3/2019 | Henry | ................ | H01R 12/7005 |
| 10,320,100 B2* | 6/2019 | Phillips | .............. | H01R 12/7005 |
| 2006/0189199 A1* | 8/2006 | Lang | .................. | H01R 12/7005 439/374 |

* cited by examiner

*Primary Examiner* — Tho D Ta

(57) ABSTRACT

A card edge connector assembly includes a card edge connector having a housing defining a card slot and holding contacts to electrically connect to a pluggable module and a host circuit board. The card edge connector assembly includes a plug guide having a main body including end walls and a side wall defining a cavity receiving the housing of the card edge connector and the pluggable module. The plug guide has first and second alignment channels receiving alignment posts of the pluggable module prior to the card slot receiving the pluggable module to guide mating of the pluggable module with the card edge connector. The plug guide has an exterior being received in a panel opening of a panel. The plug guide including a panel latching feature latchably securing the plug guide to the panel independent of the host circuit board and the card edge connector.

26 Claims, 4 Drawing Sheets

CARD EDGE CONNECTOR ASSEMBLY

BACKGROUND OF THE INVENTION

The subject matter herein relates generally to card edge connector assemblies.

Card edge connectors are used in various system applications. For example, card edge connectors are typically mounted to a host circuit board. The card edge connectors include card slots for receiving a card edge, such as a circuit card of a pluggable module. However, known card edge connectors are not without disadvantages. For instance, the card edge connectors are typically designed for supporting the pluggable modules. The card edge connectors are subjected to stresses and strains during mating or when mated with the pluggable modules, which may damage or break soldered connections between the contacts of the card edge connector and the host circuit board. Additionally, the card edge connectors are susceptible to damage due to incorrectly loading or unloading of the pluggable module when mating and unmating. For example, if the edge of the circuit card is loading into the card slot at an angle, the contacts may be damaged. Additionally, correction of the mis-alignment of the circuit card in the card slot can lead to further damage of the contacts.

Moreover, some systems limit visibility of the mating interface of the card edge connector, such as due to positioning of the card edge connector within the system, leading to the need for blind mating of the pluggable module with the card edge connector, which can lead to damage of the card edge connector during mating. Some known systems utilize guide modules to guide mating of the components, however, the guide modules may be large and occupy a large amount of space around the card guide module, leading to decreased density of connectors within the system.

A need remains for a card edge connector assembly that may be mated with pluggable modules in a reliable manner.

BRIEF DESCRIPTION OF THE INVENTION

In one embodiment, a card edge connector assembly is provided including a card edge connector having a housing defining a card slot configured to receive a pluggable module in a mating direction. The housing holds contacts in the card slot to electrically connect to the pluggable module. The contacts are configured to be electrically connected to a host circuit board. The card edge connector assembly includes a plug guide having a main body including a first end wall, a second end wall opposite the first end wall, and a first side wall between the first and second end walls. The main body defines a cavity receiving the housing of the card edge connector. The cavity is configured to receive the pluggable module. The plug guide has a first alignment channel between the cavity and the first end wall and a second alignment channel between the cavity and the second end wall. The first and second alignment channels are configured to receive alignment posts of the pluggable module prior to the card slot receiving the pluggable module to guide mating of the pluggable module with the card edge connector. The plug guide has an exterior being received in a panel opening of a panel. The plug guide including a panel latching feature configured to latchably secure the plug guide to the panel independent of the host circuit board and the card edge connector.

In a further embodiment, a card edge connector assembly is provided including an upper card edge connector and a lower card edge connector. The upper card edge connector has a housing defining a card slot configured to receive a corresponding pluggable module in a mating direction holding contacts in the card slot to electrically connect to the pluggable module and being configured to be electrically connected to an upper surface of a host circuit board proximate to an edge of the host circuit board. The lower card edge connector has a housing defining a card slot configured to receive a corresponding pluggable module in a mating direction holding contacts in the card slot to electrically connect to the pluggable module and being configured to be electrically connected to a lower surface of the host circuit board proximate to the edge. The card edge connector assembly includes a plug guide having a main body including a front and a rear. The main body includes a first end wall, a second end wall opposite the first end wall, and a first side wall between the first and second end walls. The main body defines a cavity including an upper chamber and a lower chamber. The upper chamber receives the pluggable module mated with the upper card edge connector and the lower chamber receives the pluggable module mated with the lower card edge connector. The plug guide has a board slot at the rear that receives the edge of the host circuit board to locate the plug guide relative to the upper surface and the lower surface of the host circuit board to position the upper card edge connector in the upper chamber and to position the lower card edge connector in the lower chamber. The plug guide includes a first upper alignment channel between the cavity and the first end wall and a second upper alignment channel between the cavity and the second end wall. The first and second upper alignment channels are configured to receive alignment posts of the pluggable module mated with the upper card edge connector prior to the card slot receiving the pluggable module to guide mating of the pluggable module with the upper card edge connector. The plug guide includes a first lower alignment channel between the cavity and the first end wall and a second lower alignment channel between the cavity and the second end wall. The first and second lower alignment channels are configured to receive alignment posts of the pluggable module mated with the lower card edge connector prior to the card slot receiving the pluggable module to guide mating of the pluggable module with the lower card edge connector.

In a further embodiment, a card edge connector assembly is provided including a panel having a panel opening and having a front and a rear. The card edge connector assembly includes a host circuit board having an upper surface and a lower surface and having an edge between the upper surface and the lower surface. The host circuit board is located rearward of the rear of the panel with the edge aligned with the panel opening. The card edge connector assembly includes an upper card edge connector mounted to the upper surface of the host circuit board having a housing defining a card slot configured to receive a corresponding pluggable module in a mating direction. The housing of the upper card edge connector holds contacts in the card slot to electrically connect to the pluggable module. The card edge connector assembly includes a lower card edge connector mounted to the lower surface of the host circuit board having a housing defining a card slot configured to receive a corresponding pluggable module in a mating direction. The housing of the lower card edge connector holds contacts in the card slot to electrically connect to the pluggable module. The card edge connector assembly includes a plug guide having a main body including a front and a rear. The main body including a first end wall, a second end wall opposite the first end wall, and a first side wall between the first and second end walls. The plug guide has an exterior being received in the panel opening of the panel such that the front of the plug guide is forward of the front of the panel and the rear of the plug guide is rearward of the rear of the panel. The plug guide includes a panel latching feature configured to latchably secure the plug guide to the panel independent of the host circuit board and the upper and lower card edge connectors. The main body defines a cavity including an upper chamber and a lower chamber. The upper chamber receives the pluggable module mated with the upper card edge connector and the lower chamber receives the pluggable module mated with the lower card edge connector. The plug guide has a board slot at the rear receiving the edge of the host circuit board to locate the plug guide relative to the upper surface and the lower surface of the host circuit board to position the upper card edge connector in the upper chamber and to position the lower card edge connector in the lower chamber. The plug guide includes alignment channels configured to receive alignment posts of the corresponding pluggable modules to guide mating of the pluggable modules with the corresponding upper and lower card edge connectors.

In another embodiment, an electrical system is provided including a card edge connector assembly including a plug guide having a main body including a first end wall, a second end wall opposite the first end wall, and a first side wall between the first and second end walls. The main body defines a cavity configured to receive a housing of a card edge connector. The plug guide has a first alignment channel between the cavity and the first end wall and a second alignment channel between the cavity and the second end wall. The plug guide has an exterior being received in a panel opening of a panel. The plug guide includes a panel latching feature configured to latchably secure the plug guide to the panel independent of the host circuit board and the card edge connector. The electrical system includes a pluggable module received in the cavity. The pluggable module has a module body holding a module circuit board. The pluggable module has first and second alignment posts extending forward of the module body and extending forward of the module circuit board. The first and second alignment posts are received in the first and second alignment channels prior to the module circuit board being received in a card slot of the card edge connector to guide mating of the pluggable module with the card edge connector.

DETAILED DESCRIPTION OF THE INVENTION

Figure 1:
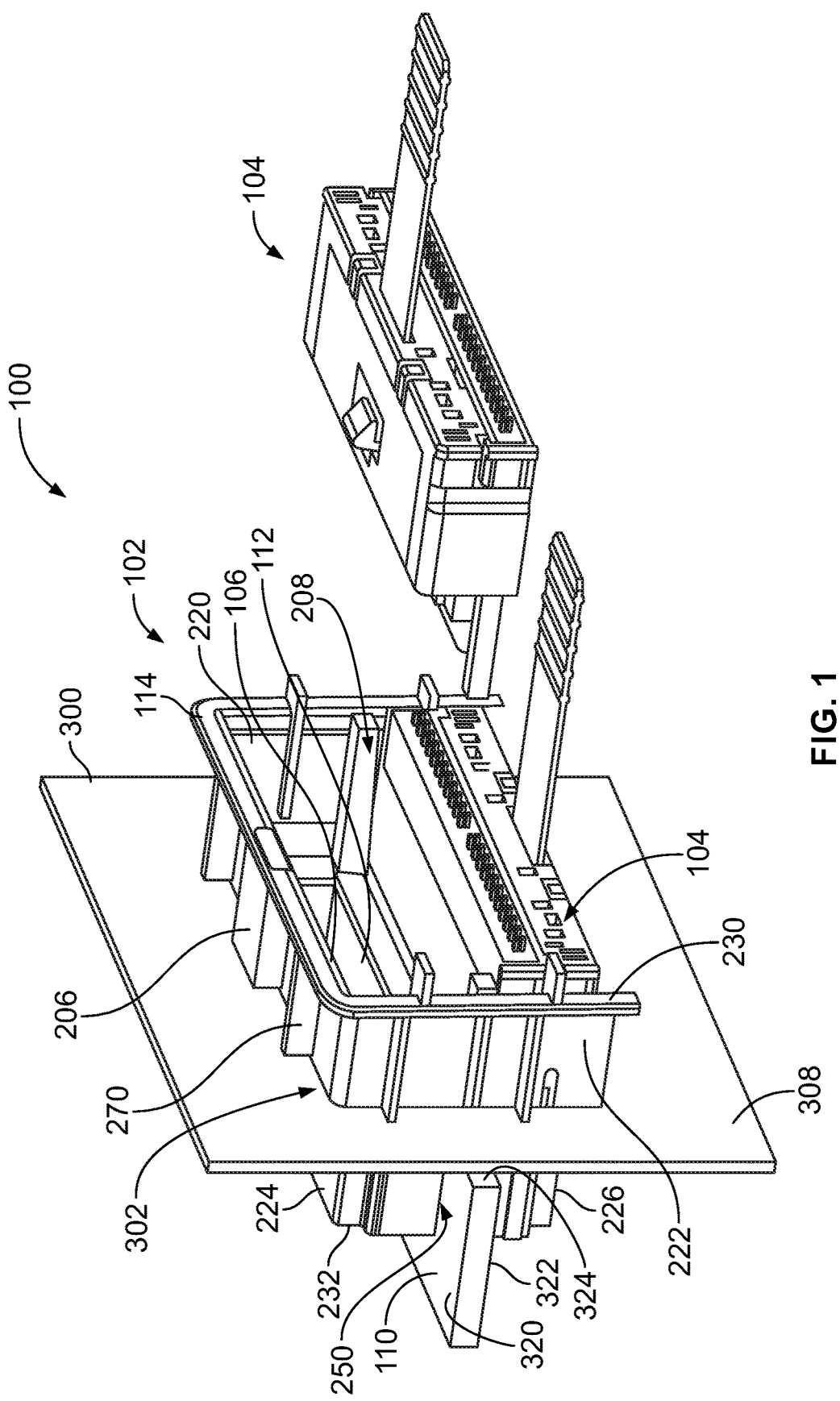
FIG. 1 is a perspective view of an electrical system having a card edge connector assembly in accordance with an exemplary embodiment.

FIG. 1 is a perspective view of an electrical system 100 having a card edge connector assembly 102 in accordance with an exemplary embodiment. The electrical system 100 includes pluggable modules 104 that are mated with the card edge connector assembly 102. FIG. 1 illustrates one of the pluggable modules 104 loaded into the card edge connector assembly 102 and one of the pluggable module 104 poised for mating with the card edge connector assembly 102. The card edge connector assembly 102 includes card edge connectors 106 (shown in FIG. 2) configured mated with corresponding pluggable modules 104. The card edge connectors 106 are mounted to a host circuit board 110.

The card edge connector assembly 102 includes the card edge connectors 106, front shrouds 112 for the card edge connectors 106 and a plug guide 114 for the card edge connectors 106. The card edge connectors 106 are mounted to the host circuit board 110. In the illustrated embodiment, the card edge connectors 106 are mounted to both an upper surface 320 and a lower surface 322 of the host circuit board 110. However, in alternative embodiments, the card edge connector assembly 102 may include a single card edge connector 106 mounted to one of the surfaces 320, 322 of the host circuit board 110. The plug guide 114 is mounted over the card edge connectors 106 and the front shrouds 112. In an exemplary embodiment, the plug guide 114 is coupled to the host circuit board 110, such as to an edge 324 of the host circuit board 110. The plug guide 114 may be a straddle mount plug guide coupled to the edge 324. The plug guide 114 may straddle the edge 324.

The pluggable modules 104 are configured to be mated with the card edge connectors 106. The front shroud 112 is used to guide mating and unmating of the pluggable modules 104 with the card edge connectors 106. The plug guide 114 is used to guide mating and unmating of the pluggable module 104 with the front shroud 112 and the card edge connector 106. The plug guide 114 provides initial alignment of the pluggable modules 104, such as to square up the pluggable modules 104 with the corresponding front shroud 112 and the card edge connector 106. The plug guide 114 may provide course alignment, while the front shrouds 112 may provide fine alignment. In an exemplary embodiment, stress and strain from mating and use of the pluggable module 104 may be transferred to the plug guide 114 rather than to the card edge connectors 106. As such, the plug guide 114 may reduce stresses and strains on the card edge connector 106. For example, torsional loads on the pluggable module 104, such as from the cables of the pluggable modules 104 may be transferred to the plug guide 114 rather than the card edge connectors 106.

Figure 2:
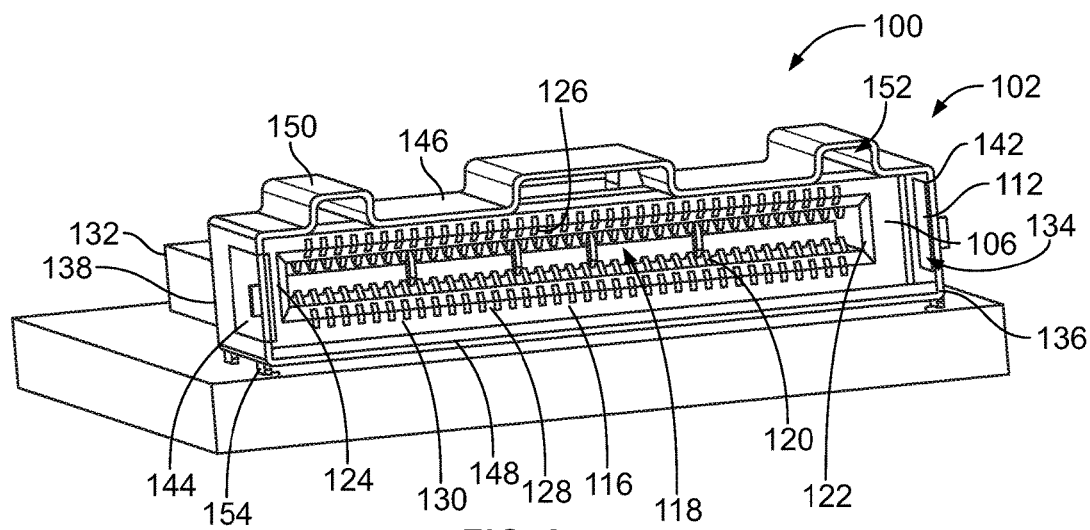
FIG. 2 is a front perspective view of a portion of the card edge connector assembly showing a card edge connector in accordance with an exemplary embodiment.

FIG. 2 is a front perspective view of a portion of the card edge connector assembly 102 showing one of the card edge connectors 106 and the corresponding front shroud 112 in accordance with an exemplary embodiment. In the illustrated embodiment, the card edge connector 106 is a right-angle card edge connector where the mating and mounting ends of the card edge connector 106 are oriented perpendicular such that the pluggable module 104 is mated parallel to the host circuit board 110 (shown in FIG. 1). However, in other various embodiments, the electrical system 100 may have components in different orientations, such as in a vertical orientation where the components are mated in a vertical direction perpendicular to the host circuit board 110. Other types of card edge connectors may be utilized in alternative embodiments.

In an exemplary embodiment, the card edge connector 106 includes a housing 116 having a card slot 118. In various embodiments, the housing 116 is manufactured from plastic material. For example, the housing 116 may be a molded plastic housing.

The housing 116 holds a plurality of contacts 120 in the card slot 118 for mating with the corresponding pluggable module 104. In an exemplary embodiment, the contacts 120 are arranged in two rows on opposite sides of the card slot 118 for electrically connecting to opposite sides of the pluggable module 104. The card edge connector 106 is configured to be mounted to the host circuit board 110, such as by soldering the contacts 120 of the card edge connector 106 to the host circuit board 110; however, the contacts 120 may be attached by other processes such as press fit contacts, spring beam contacts, and the like.

The housing 116 includes a first end wall 122 and a second end wall 124 opposite the first end wall 122. The housing 116 includes a first side wall 126 and a second side wall 128 opposite the first side wall 126. The side walls 126, 128 extend between the end walls 122, 124. The second side wall 128 may be a mounting wall configured to be mounted to the host circuit board 110. In various embodiments, the housing 116 may be oriented such that the first side wall 126 is a top wall and the second side wall 128 is a bottom wall (e.g., when the card edge connector 106 is an upper card edge connector mounted to an upper surface 320 of the host circuit board 110). In other various embodiments, the housing 116 may be oriented such that the first sidewall 126 is a bottom wall and the second side wall 128 is a top wall (e.g., when the card connector 106 is a lower card edge connector mounted to a lower surface 322 of the host circuit board 110). In various embodiments, the card slot 118 is oriented horizontally; however, other orientations are possible in alternative embodiments. The card slot 118 is defined between the side walls 126, 128. The contacts 120 are arranged along the first and second side walls 126, 128.

In an exemplary embodiment, the housing 116 extends between a front 130 and a rear 132. The card slot 118 is open at the front 130 to receive the pluggable module 104. The front 130 defines a mating end of the card edge connector 106 to receive the pluggable module 104 in a mating direction, such as a mating direction parallel to the host circuit board 110. Other orientations are possible in alternative embodiments, such as with the rear 132 defining the mounting end and with the card slot 118 oriented vertically.

The front shroud 112 is used to guide mating of the pluggable module 104 with the card edge connector 106. The front shroud 112 may be used to couple the plug guide 114 (shown in FIG. 1) to the card edge connector 106. In the illustrated embodiment, the front shroud 112 is separate and discrete from the housing 116. Alternatively, the front shroud 112 may be an integral part of the housing 116. For example, the front shroud 112 may be molded with the housing 116 as a unitary, monolithic structure. In an exemplary embodiment, the front shroud 112 is a stamped and formed structure sized and shaped to fit around the exterior of the housing 116. The front shroud 112 may be manufactured by other processes in alternative embodiments, such as being a molded piece.

The front shroud 112 includes walls defining a cavity 134 that receives the housing 116. The walls of the front shroud 112 extend between a front 136 and a rear 138. Optionally, the front 136 may be forward of the front 130 of the housing 116. For example, the front shroud 112 may be positioned forward of the housing 116 to interact with the pluggable module 104 prior to the pluggable module 104 interacting with the housing 116 and/or the contacts 120. As such, the front shroud 112 is used to orient the pluggable module 104 relative to the housing 116 and/or the contacts 120 prior to the pluggable module 104 engaging the housing 116 and/or the contacts 120. The front shroud 112 may be used to position the pluggable module 104 side to side and/or end to end relative to the housing 116.

In an exemplary embodiment, the front shroud 112 includes a first end wall 142 and a second end wall 144 opposite the first end wall 142. The front shroud 112 includes a first side wall 146 extending between the first end wall 142 and the second end wall 144. The front shroud 112 may include a second side wall 148 opposite the first side wall 146. The second side wall 148 may be located forward of the housing 116 and/or may be located between the housing 116 and the host circuit board 110. In various embodiments, the front shroud 112 may be oriented such that the first side wall 146 is a top wall and the second side wall 148 is a bottom wall. In other various embodiment, the front shroud 112 will be oriented such that the first sidewall 146 is a bottom wall and the second sidewall 148 is a top wall.

The first side wall 146 includes one or more guide features 150 configured to engage the pluggable module 104 to guide mating of the pluggable module 104 with the card edge connector 106. In other embodiments, the second side wall 148 may additionally or alternatively include the guide features 150. In the illustrated embodiment, each guide feature 150 includes a track 152. The side wall 146 may be stepped to define the tracks 152. The tracks 152 may be open to the cavity 134 to receive portions of the pluggable module 104. Other types of guide features 150 may be used in alternative embodiments, such as posts, rails, tabs, channels and the like.

In an exemplary embodiment, the front shroud 112 is directly mounted to the host circuit board 110. For example, the front shroud 112 includes mounting features 154 coupled to the host circuit board 110. In the illustrated embodiment, the mounting features 154 are pins extending from the first and second end walls 142, 144. The mounting features 154 may be compliant pins press-fit into the host circuit board 110. In other various embodiments, the mounting features 154 may be solder pins configured to be soldered to pads or vias of the host circuit board 110. Other types of mounting features may be used in alternative embodiments, such as clips, fasteners and the like. Separately mounting the front shroud 112 to the host circuit board 110 transfers stresses and strains during mating or use of the pluggable module 104 to the host circuit board 110 rather than being transferred to the housing 116, which may protect the contacts 120 from damage.

The front shroud 112 may include locating features for locating the front shroud 112 relative to the housing 116. For example, the locating features may include slots, tabs, latches and the like that interact with complementary features of the housing 116 to position the front shroud 112 relative to the housing 116.

Figure 4:
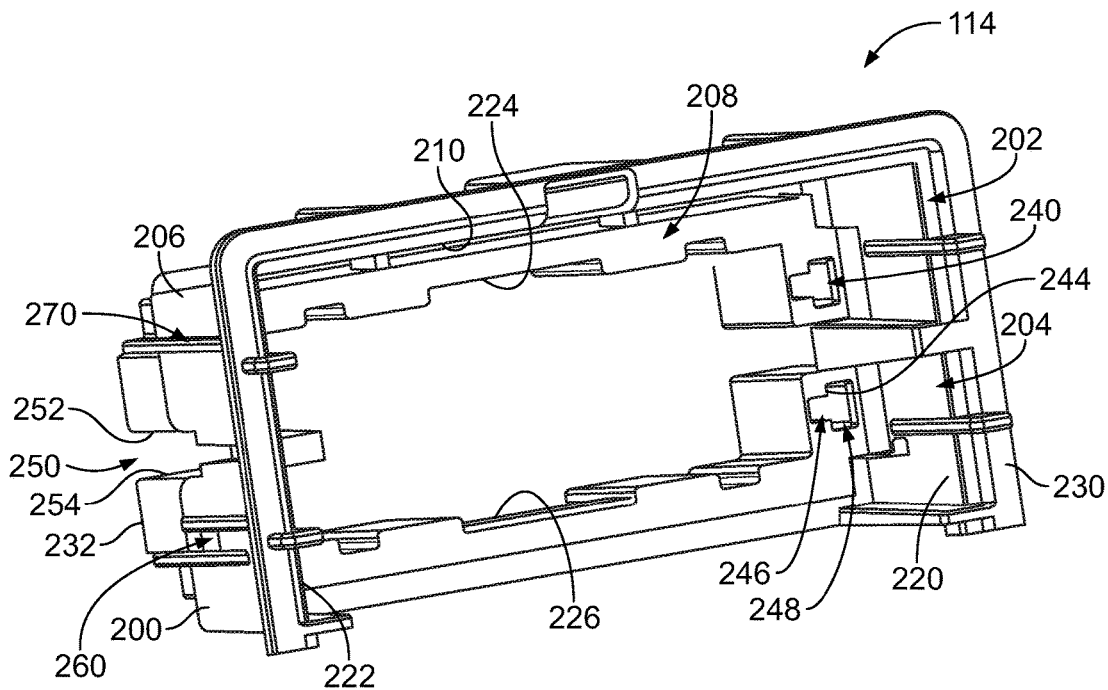
FIG. 4 is a front perspective view of the plug guide in accordance with an exemplary embodiment.
Figure 3:
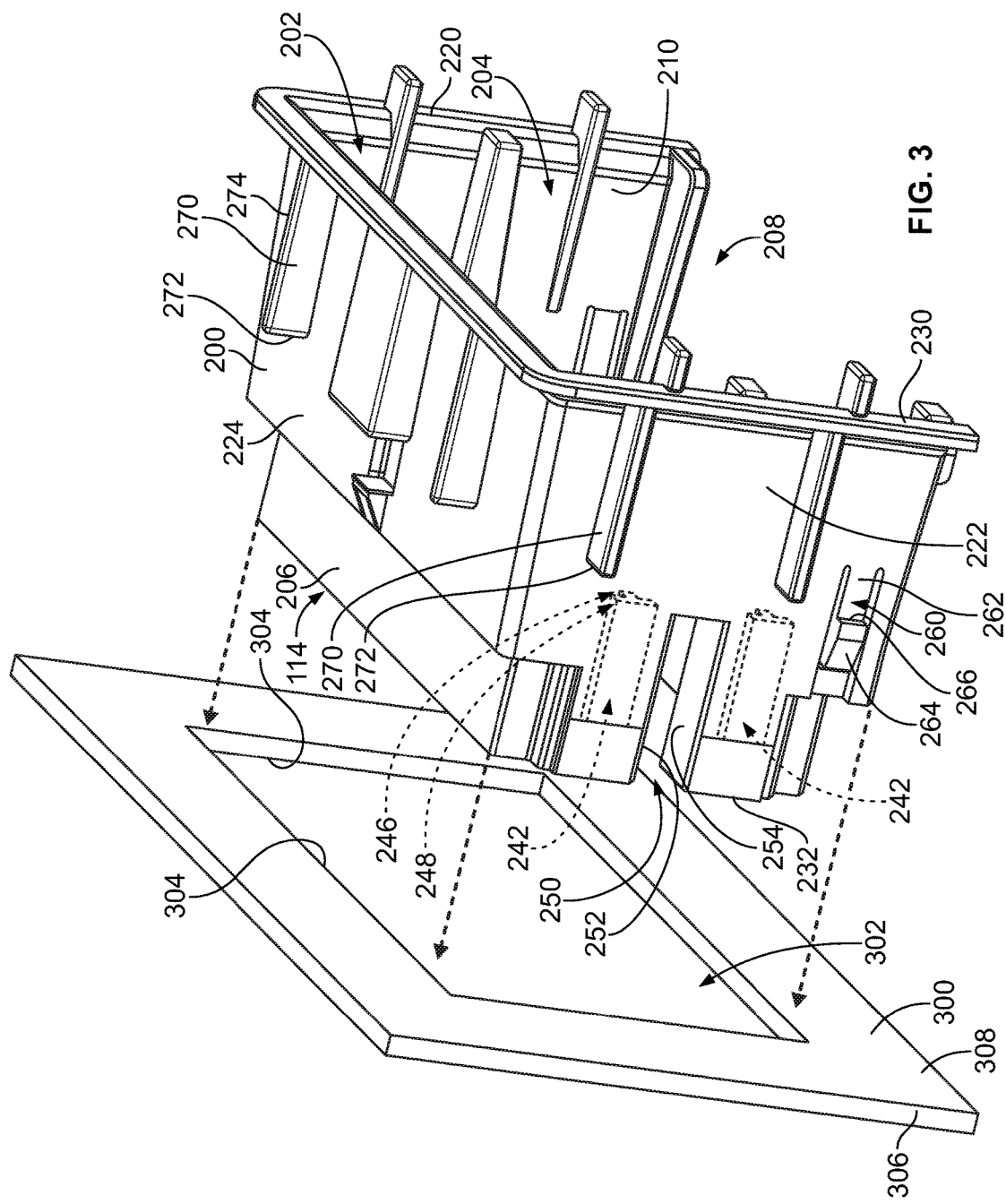
FIG. 3 is a side perspective view of a plug guide of the card edge connector assembly in accordance with an exemplary embodiment.

FIG. 3 is a side perspective view of the plug guide 114 in accordance with an exemplary embodiment. FIG. 4 is a front perspective view of the plug guide 114 in accordance with an exemplary embodiment. In an exemplary embodiment, the plug guide 114 includes an exterior 200 configured to be mounted to a panel 300 (shown in FIG. 3) in a panel opening 302. The exterior 200 faces panel opening edges 304 of the panel 300. In an exemplary embodiment, the panel opening 302 is oversized to allow the plug guide 114 to float within the panel opening 302 in one or more directions, such as in vertical and horizontal directions (e.g., X and Y directions) that are mutually perpendicular to the mating direction (e.g., Z direction). The size of the panel opening 302 relative to the exterior 200 defines a limited amount of floating movement of the plug guide 114 within the panel opening 302. In an exemplary embodiment, the plug guide 114 is configured to be coupled to the host circuit board 110. The plug guide 114 may be mounted to the host circuit board 110. In various embodiments, the plug guide 114 is a straddle mount connector configured to be mounted to both sides of the host circuit board 110. In other various embodiments, the plug guide 114 may be mounted to the upper surface 320 or the lower surface 322 of the host circuit board 110, rather than be mounted to both the upper and lower surfaces of the host circuit board 110.

In an exemplary embodiment, the plug guide 114 is mounted to the host circuit board 110 independent of the card edge connector 106 and the front shroud 112 such that the plug guide 114 is self-supporting and not supported by the card edge connector 106. In an exemplary embodiment, the plug guide 114 is mounted to the panel 300 independent of the card edge connector 106 such that the plug guide 114 is self-supporting on the panel 300 and not supported by the card edge connector 106. In an exemplary embodiment, the plug guide 114 includes guide members for guiding mating of the pluggable modules 104 with the card edge connectors 106. The plug guide 114 supports the pluggable modules 104 and alleviates stress or strain on the card edge connector 106 from the pluggable module 104, such as from movement of the pluggable module 104. The plug guide 114 transfer stresses or strains from the pluggable modules 104 into the host circuit board 110 and/or the panel 300 to alleviate stress or strain on the card edge connector 106.

The plug guide 114 includes a main body 206 having one or more mounting features for mounting the plug guide 114 to the host circuit board 110 and the panel 300. The main body 206 includes a cavity 208 that receives and/or surrounds the card edge connectors 106 and the pluggable modules 104. The cavity 208 receives the pluggable modules 104 during mating. The plug guide 114 guides mating of the pluggable modules 104 with the card edge connectors 106. In an exemplary embodiment, the cavity 208 includes an upper chamber 202 and a lower chamber 204 that received the upper and lower card edge connectors 106, respectively and the corresponding pluggable modules 104.

The main body 206 includes an interior 210 that defines the cavity 208. The interior 210 faces the upper and lower chambers 202, 204. The card edge connector 106 and/or the front shroud 112 may engage the interior 210 to position the plug guide 114 relative to the card edge connectors 106 and/or the front shrouds 112. The interior 210 may define a locating surface for locating the plug guide 114 relative to the card edge connectors 106 and/or the front shrouds 112. The interior 210 may include vertical surfaces, angled surfaces and/or shoulder surfaces for engaging and locating various complementary surfaces of the card edge connectors 106 and/or the front shrouds 112.

The main body 206 includes a plurality of walls. In the illustrated embodiment, the walls include a first end wall 220, a second end wall 222 opposite the first end wall 220, a first side wall 224 extending between the end walls 220, 222, and a second side wall 226 opposite the first side wall 224 extending between the end walls 220, 222. In an exemplary embodiment, the side walls 224, 226 are wider than the first and second end walls 220, 222. The main body 206 includes a front 230 and a rear 232. In an exemplary embodiment, the cavity 208 is open at the front 230, and may be open at the rear 232. The pluggable modules 104 are configured to be loaded into the plug guide 114 through the front 230. The main body 206 may have other shapes in alternative embodiments, such as including additional walls.

In an exemplary embodiment, the plug guide 114 includes alignment channels associated with the upper and lower chambers 202, 204 that received corresponding alignment posts of the pluggable modules 104. For example, each of the chambers 202, 204 includes a first alignment channel 240 (e.g., first upper alignment channel or first lower alignment channel) between the cavity 208 and the first end wall 220 and a second alignment channel 242 (shown in phantom in FIG. 3 and further illustrated in FIG. 6) (e.g., second upper alignment channel or second lower alignment channel) between the cavity 208 and the second end wall 222. The alignment channels 240, 242 are configured to receive corresponding alignment posts of the pluggable module 104 to align the pluggable module 104 with the card edge connector 106. The alignment channels 240, 242 are open at the front 230 to receive the alignment posts of the pluggable module 104. The alignment channels 240, 242 are configured to receive the alignment posts of the pluggable module 104 prior to the card slot 118 receiving the pluggable module 104. The alignment channels 240, 242 provide the initial alignment of the pluggable module 104, such as to square up the pluggable module 104 with the front shroud 112 and the card edge connector 106.

The alignment channels 240, 242 are defined by alignment walls 244. The alignment walls 244 may engage and locate the pluggable module 104 relative to the plug guide 114. In an exemplary embodiment, the alignment channels 240, 242 include inner channels 246 and outer channels 248 that are open at the front 230 to receive corresponding portions of the pluggable module 104. The inner channels 246 have different heights and/or widths compared to the outer channels 248 to form angled corners within the alignment channels 240, 242. The corners resist rotation of the alignment posts in the alignment channels 240, 242. The alignment channels 240, 242 may have lead-in surfaces to resist binding or stubbing as the alignment posts are loaded into the alignment channels 240, 242. The alignment channels 240, 242 may be shaped to provide tighter or finer positioning as the alignment posts are loaded into the alignment channels 240, 242. Other types of guide features may be provided in the alignment channels 240, 242 in alternative embodiments.

In an exemplary embodiment, the plug guide 114 includes a board slot 250 at the rear 232. The board slot 250 is configured to receive the host circuit board 110. The board slot 250 is used to align the plug guide 114 with the host circuit board 110. The board slot 250 includes at least one slot wall that orients the plug guide 114 relative to the host circuit board 110. For example, the board slot 250 includes an upper slot wall 252 and a lower slot wall 254. The upper slot wall 252 is configured to engage the upper surface 320 (FIG. 1) of the host circuit board 110. The lower slot wall 254 is configured to engage the lower surface 322 (FIG. 1) of the host circuit board 110. In an exemplary embodiment, the upper slot wall 252 and/or the lower slot wall 254 is angled non-parallel to the other slot wall, such as to form a funnel for locating the plug guide 114 on the host circuit board 110. The board slot 250 is wide at the rear 232 and narrows forward of the rear 232 to guide the host circuit board 110 into the board slot 250. In an exemplary embodiment, the board slot 250 is approximately centered between the first and second side walls 224, 226. For example, the board slot 250 is approximately centered between the upper chamber 202 and the lower chamber 204.

The plug guide 114 includes features for coupling the plug guide 114 to the panel 300 (shown in FIG. 3). In an exemplary embodiment, the plug guide 114 includes panel latching features 260 and panel locating features 270. The panel latching features 260 are configured to be latchably secured to the panel 300. For example, the panel latching features 260 include deflectable latches 262 configured to be releasably coupled to the panel 300. The deflectable latches 262 have ramps 264 and latching shoulders 266 forward of the ramps 264. The latching shoulders 266 are forward facing in the illustrated embodiment, however, the latching shoulders 266 may have other orientations in alternative embodiments. The latching shoulders 266 are configured to engage a rear 306 of the panel 300 when coupled thereto.

The panel locating features 270 include stop surfaces 272 configured to engage the panel 300, such as a front 308 of the panel 300 to locate the plug guide 114 relative to the panel 300. The plug guide 114 may be loaded into the panel opening 302 in a rearward loading direction until the stop surfaces 272 engage the front 308 of the panel 300. The stop surfaces 272 are rearward facing. The stop surfaces 272 are formed on ribs 274. The stop surfaces 272 are located forward of the latching shoulders 266 by a distance corresponding to a thickness of the panel 300. The panel is configured to be captured between the stop surfaces 272 and the latching shoulders 266. The distance may be slightly wider than the thickness to ensure that the deflectable latches 262 clear the panel 300 and snap to latched positions behind the panel 300.

With additional reference back to FIG. 1, in an exemplary embodiment, the host circuit board 110 is located relative to the panel 300 such that the host circuit board 110 is generally aligned with the panel opening 302. The plug guide 114 is loaded into the panel opening 302 from the front 308 of the panel 300. The front 230 of the plug guide 114 extends forward of the front 308 of the panel 300 when the panel locating features 270 are seated against the front 308 of the panel 300. The rear 232 of the plug guide 114 is loaded through the panel 300 to interact with and engage the host circuit board 110. The board slot 250 receives the edge 324 of the host circuit board 110. In an exemplary embodiment, the plug guide 114 is located in the panel opening 302 by the host circuit board 110. For example, the plug guide 114 is able to move in the panel opening 302 (e.g., up, down, left, right) to align with the host circuit board 110 and the card edge connectors 106 on the host circuit board 110. Both the upper and lower card edge connectors 106 are located within the same cavity 208. The host circuit board 110 and the upper and lower card edge connectors 106 are sandwiched between the first and second side walls 224, 226 of the plug guide 114.

Once positioned relative to the card edge connectors 106, the plug guide 114 is able to guide mating of the pluggable modules 104 with the card edge connectors 106. The plug guide 114 is able to locate both the upper and lower pluggable modules 104 relative to each other and relative to the corresponding card edge connectors 106. Both pluggable modules 104 are configured to be received in the cavity 208 of the plug guide 114. The end walls 220, 222 both include the corresponding alignment features for aligning the upper and lower pluggable modules 104. As such, multiple pluggable modules 104 are received in the same body 206 of the plug guide 114.

During assembly, when the panel latching features 260 and the panel locating features 270 engage the panel 300, the plug guide 114 is held on the panel 300 in the panel opening 302 and restricted from moving in the loading direction. Optionally, the panel opening 302 may be oversized to allow a limited amount of floating movement of the plug guide 114 in the panel opening 302, such as in one or more directions perpendicular to the loading direction. The floating movement allows the board slot 250 to receive the host circuit board 110 and allows the plug guide 114 to be located (e.g., top/bottom and/or left/right) relative to the host circuit board 110 and the card edge connectors 106 independent of the position of the panel 300 relative to the host circuit board 110.

Figure 5:
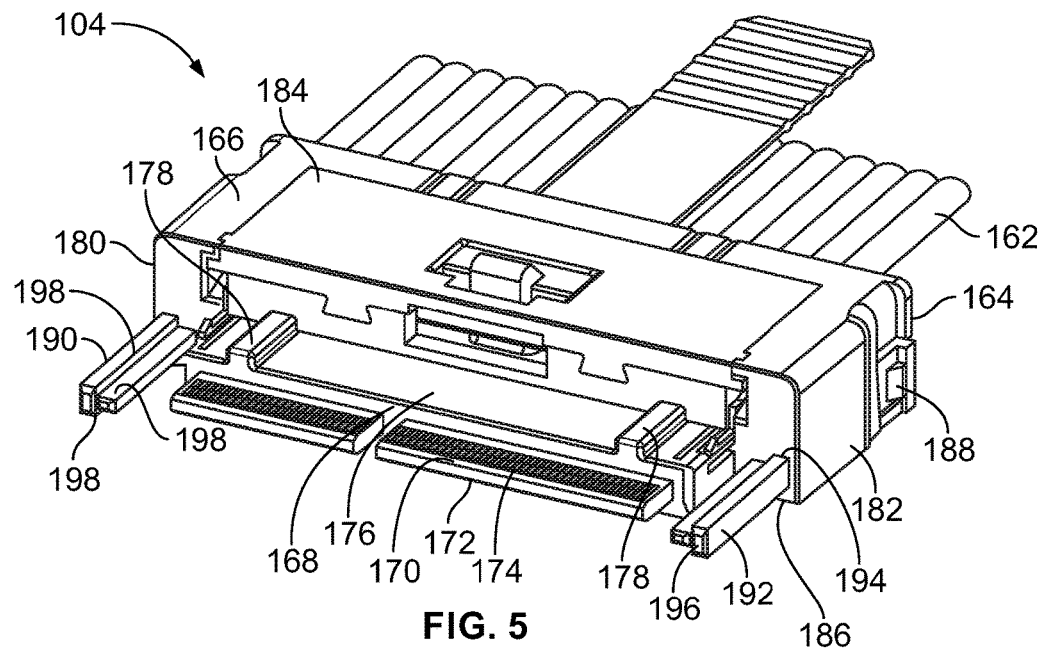
FIG. 5 is a perspective view of the pluggable module in accordance with an exemplary embodiment.

FIG. 5 is a perspective view of the pluggable module 104 in accordance with an exemplary embodiment. In the illustrated embodiment, the pluggable module is a cabled pluggable module having one or more cables 162 extending from a cable end or rear 164 of the pluggable module 104; however, other types of pluggable modules may be utilized in alternative embodiments, such as non-cabled pluggable modules. The pluggable module 104 includes a plug body 166 holding a plug card 170, such as a circuit card, at a mating end or front 168 of the pluggable module 104. The plug card 170 may extend forward of the plug body 166 a distance for loading into the card edge connector 106 (shown in FIG. 2). The cables 162 are terminated to the plug card 170, such as by soldering to the plug card 170. Optionally, the plug body 166 may be overmolded over the plug card 170 and the cables 162.

The plug card 170 has a card edge 172 at the mating end 168 configured to be loaded into the card edge connector 106. The pluggable module 104 has a plurality of plug contacts 174 at the card edge 172 configured to be electrically connected to the card edge connector 106. The plug contacts 174 may be pads or traces on the circuit card defining the plug card 170. Other types of plug contacts 174 may be used in alternative embodiments. Optionally, the pluggable module 104 may include one or more electrical components (not shown) on the plug card 170, such as a memory, a processor, or other types of electrical components. The electrical components are electrically connected to corresponding plug contacts 174. The pluggable module 104 includes various circuits transmitting data and/or power between the plug contacts 174, the electrical components, and the cables 162. The pluggable module 104 may include one or more heat sinks for dissipating heat from the pluggable module 104.

In an exemplary embodiment, the pluggable module 104 includes a hub 176 surrounding the plug card 170. In an exemplary embodiment, the hub 176 includes one or more guide ribs 178 used to guide mating with the front shroud 112. For example, the guide ribs 178 may extend parallel to the mating direction and are configured to be received in the tracks 152 of the front shroud 112. Other types of guide features may be provided on the hub 176 in alternative embodiments.

The hub 176 extends between a first end 180 and a second end 182. The pluggable module 104 has a first side 184 and a second side 186 between the first and second ends 180, 182. The sides 184, 186 are wider than the ends 180, 182. In the illustrated embodiment, the guide ribs 178 extend along the first side 184. The pluggable module 104 includes latching features 188 at the first side 184 and/or the second side 186 for securing the pluggable module 104 in the card edge connector assembly 102.

The pluggable module 104 includes a first alignment post 190 outboard of the first end 180 of the hub 176 and a second alignment post 192 outboard of the second end 182 of the hub 176. The first and second alignment posts 190, 192 flank the opposite ends of the hub 176. Each alignment post 190, 192 extends between a base 194 and a distal end 196. The base 194 extends from the hub 176. In an exemplary embodiment, the distal ends 196 are forward of the front of the hub 176. As such, the alignment posts 190, 192 are configured to engage the plug guide 114 prior to the hub 176 engaging the plug guide 114. In an exemplary embodiment, the distal ends 196 are forward of the card edge 172 of the plug card 170. As such, the alignment posts 190, 192 are configured to engage the plug guide 114 prior to the plug card 170 engaging the plug guide 114.

The alignment posts 190, 192 may have an appropriate shape for loading into the alignment channels 240, 242 of the plug guide 114. In the illustrated embodiment, the alignment posts 190, 192 are T-shaped; however, the alignment posts 190, 192 may have other shapes in alternative embodiments. For example, the alignment posts 190, 192 may be cross-shaped, rectangular, circular or have other shapes. In an exemplary embodiment, each alignment post 190, 192 includes ribs 198 that are used to orient the alignment posts 190, 192 within the alignment channels 240, 242 of the plug guide 114. The ribs 198 form the T-shaped alignment posts 190, 192. The ribs 198 are configured to be receive in the inner and outer channels 246, 248 (shown in FIG. 4) of the alignment channels 240, 242.

Figure 6:
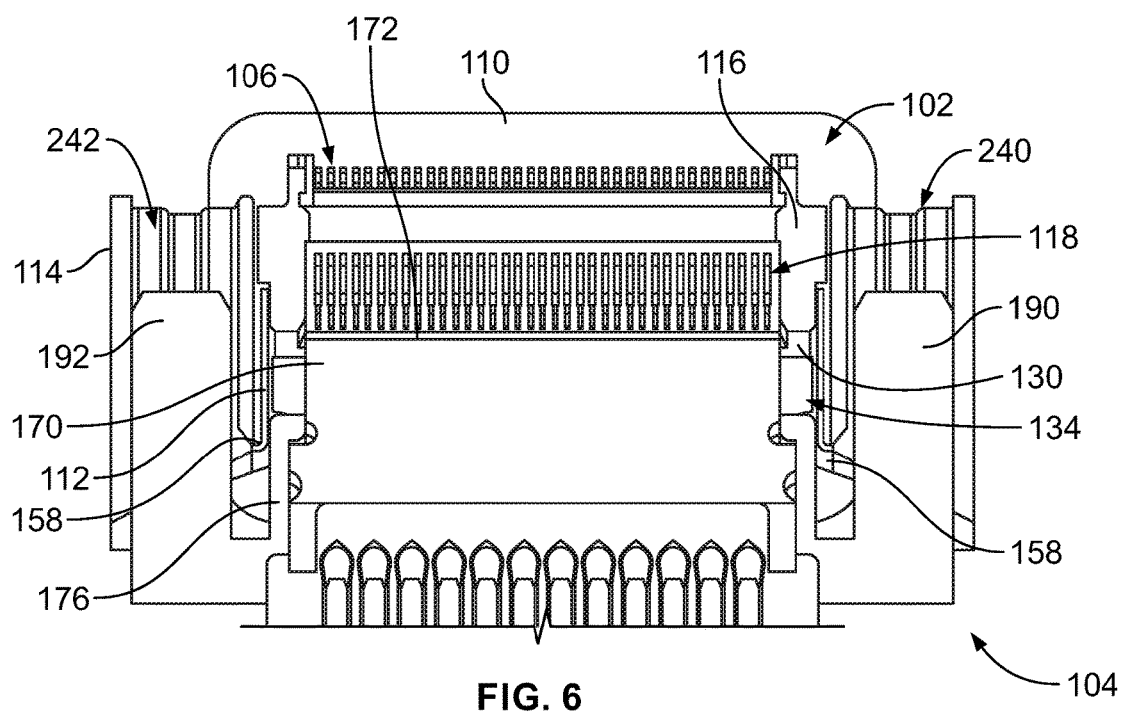
FIG. 6 is a cross sectional view of the card edge connector assembly in accordance with an exemplary embodiment showing a pluggable module loaded into the plug guide in accordance with an exemplary embodiment.

FIG. 6 is a cross sectional view of the card edge connector assembly 102 in accordance with an exemplary embodiment showing the pluggable module 104 loaded into the plug guide 114 in accordance with an exemplary embodiment. In an exemplary embodiment, the front shroud 112 includes latching features 158 used to latchably secure the plug guide 114 to the front shroud 112, and thus the host circuit board 110. The latching features 158 may be deflectable latches, such as at front ends of the front shroud 112 used to engage and hold the plug guide 114 relative to the front shroud 112. Other types of latching features may be used in alternative embodiments.

During mating and unmating, the plug guide 114 is used to orient the pluggable module 104 relative to the card edge connector 106 and guide mating in the mating direction and unmating in the opposite direction. The alignment posts 190, 192 are received in the alignment channels 240, 242 to guide mating and unmating. The alignment posts 190, 192 center of the hub 176 relative to the front shroud 112. As such, the hub 176 may be received in the cavity 134 of the front shroud 112. The alignment posts 190, 192 are received in the alignment channels 240, 242 prior to the plug card 170 being received in the card slot 118. The alignment posts 190, 192 and the alignment channels 240, 242 cooperate to center the plug card 170 relative to the card slot 118. The alignment posts 190, 192 and the alignment channels 240, 242 cooperate to square up the card edge 172 relative to the housing 116 to ensure that the card edge 172 is parallel to the front 130 of the housing 116. The alignment posts 190, 192 and the alignment channels 240, 242 ensure that the plug card 170 is loaded straight into the card slot 118 rather than be loaded at an angle and twisting or rotating the plug card 170 into the housing 116.

In an exemplary embodiment, the alignment posts 190, 192 extend forward of the card edge 172 of the plug card 170 such that the alignment posts 190, 192 are loaded into the plug guide 114 prior to the plug card 170 being loaded into the plug guide 114. The alignment posts 190, 192 interact with the plug guide 114 prior to loading the pluggable module 104 into the front shroud 112 and/or the housing 116. The alignment posts 190, 192 are outboard of the plug card 170 so as to not interfere with mating of the plug card 170 with the housing 116. The alignment channels 240, 242 are outboard of the housing 116 so as to not interfere with mating of the plug card 170 with the housing 116. The alignment posts 190, 192 are received in the alignment channels 240, 242 to resist torsion loads or rotation of the pluggable module 104 relative to the plug guide 114, such as when pulling on the cable of the pluggable module 104. The edges of the alignment posts 190, 192 may engage the interior walls of the alignment channels 240, 242 to resist torsion loads or rotation of the pluggable module 104 relative to the plug guide 114. The alignment post 190, 192 are long alignment features to resist torsion loads or rotation of the pluggable module 104 relative to the plug guide 114. In various embodiments, the alignment posts 190, 192 provide course alignment of the pluggable module 104. The guide ribs 178 and/or the plug card 170 may provide fine alignment of the pluggable module 104 at a tighter tolerance than the rough alignment provided by the alignment posts 190, 192.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A card edge connector assembly comprising:
    a card edge connector having a housing defining a card slot configured to receive a pluggable module in a mating direction, the housing holding contacts in the card slot to electrically connect to the pluggable module, the contacts being configured to be electrically connected to a host circuit board; and
    a plug guide having a main body including a first end wall, a second end wall opposite the first end wall, and a first side wall between the first and second end walls, the main body defining a cavity receiving the housing of the card edge connector, the cavity configured to receive the pluggable module, the plug guide having a first alignment channel between the cavity and the first end wall, the plug guide having a second alignment channel between the cavity and the second end wall, the first and second alignment channels being configured to receive alignment posts of the pluggable module prior to the card slot receiving the pluggable module to guide mating of the pluggable module with the card edge connector, the plug guide having an exterior being received in a panel opening of a panel, the plug guide including a panel latching feature configured to latchably secure the plug guide to the panel independent of the host circuit board and the card edge connector.

2. The card edge connector assembly of claim 1, wherein the plug guide includes a panel locating feature configured to locate the plug guide relative to the panel.

3. The card edge connector assembly of claim 1, wherein the plug guide includes a panel locating feature having a rear facing stop surface configured to engage a front of the panel to locate the plug guide relative to the front of the panel, the panel latching feature configured to engage a rear of the panel to capture the panel between the panel latching feature and the panel locating feature.

4. The card edge connector assembly of claim 1, wherein the plug guide is configured to engage the panel such that the plug guide is movable relative to the panel in a direction perpendicular to the mating direction when the panel latching feature is latchably secured to the panel.

5. The card edge connector assembly of claim 1, wherein the panel latching feature includes a deflectable latch configured to be releasably coupled to the panel.

6. The card edge connector assembly of claim 1, wherein the plug guide is sized relative to the panel opening to be movable in the panel opening to locate the plug guide relative to the host circuit board.

7. The card edge connector assembly of claim 1, wherein the plug guide includes a board slot at a rear of the plug guide configured to receive an edge of the host circuit board to locate the plug guide relative to the host circuit board.

8. The card edge connector assembly of claim 7, wherein the board slot includes an upper slot wall and a lower slot wall, the upper slot wall being non-parallel to the lower slot wall.

9. The card edge connector assembly of claim 1, wherein the cavity of the plug guide includes an upper chamber and a lower chamber, the upper chamber receives the card edge connector and the pluggable module, the lower chamber receives a lower card edge connector and a corresponding lower pluggable module, the plug guide locates the pluggable module and the lower pluggable module relative to each other for mating with the card edge connector and the lower card edge connector, respectively.

10. The card edge connector assembly of claim 9, wherein the plug body includes a second side wall opposite the first side wall extending between the first and second end walls, the card edge connector, the lower card edge connector and the host circuit board being sandwiched between the first and second side walls.

11. The card edge connector assembly of claim 1, wherein the plug guide is a straddle mount plug guide configured to straddle the host circuit board for locating pluggable modules both above and below the host circuit board.

12. The card edge connector assembly of claim 1, wherein the plug guide extends forward of the card edge connector to receive and orient the pluggable module prior to the pluggable module being loaded into the card slot.

13. The card edge connector assembly of claim 1, further comprising a front shroud coupled to a front of the card edge connector, the front shroud having a latching feature configured to be latchably coupled to the plug guide.

14. The card edge connector assembly of claim 1, wherein first and second alignment channels each include an inner channel and an outer channel extending in the mating direction, the inner channel having a different height than the outer channel.

15. The card edge connector assembly of claim 1, wherein the first and second alignment channels are T-shaped.

16. A card edge connector assembly comprising:
an upper card edge connector having a housing defining a card slot configured to receive a corresponding pluggable module in a mating direction, the housing of the upper card edge connector holding contacts in the card slot to electrically connect to the pluggable module, the contacts being configured to be electrically connected to an upper surface of a host circuit board proximate to an edge of the host circuit board;
a lower card edge connector having a housing defining a card slot configured to receive a corresponding pluggable module in the mating direction, the housing of the lower card edge connector holding contacts in the card slot to electrically connect to the pluggable module, the contacts being configured to be electrically connected to a lower surface of the host circuit board proximate to the edge; and
a plug guide having a main body including a front and a rear, the main body including a first end wall, a second end wall opposite the first end wall, and a first side wall between the first and second end walls, the main body defining a cavity including an upper chamber and a lower chamber, the upper chamber configured to receive the pluggable module mated with the upper card edge connector, the lower chamber configured to receive the pluggable module mated with the lower card edge connector, the plug guide having a board slot at the rear, the board slot configured to receive the edge of the host circuit board to locate the plug guide relative to the upper surface and the lower surface of the host circuit board to position the upper card edge connector in the upper chamber and to position the lower card edge connector in the lower chamber, the plug guide including a first upper alignment channel between the cavity and the first end wall, the plug guide having a second upper alignment channel between the cavity and the second end wall, the first and second upper alignment channels being configured to receive alignment posts of the pluggable module mated with the upper card edge connector prior to the card slot receiving the pluggable module to guide mating of the pluggable module with the upper card edge connector, the plug guide including a first lower alignment channel between the cavity and the first end wall, the plug guide having a second lower alignment channel between the cavity and the second end wall, the first and second lower alignment channels being configured to receive alignment posts of the pluggable module mated with the lower card edge connector prior to the card slot receiving the pluggable module to guide mating of the pluggable module with the lower card edge connector.

17. The card edge connector assembly of claim 16, wherein the plug guide has an exterior being received in a panel opening of a panel, the plug guide including a panel latching feature configured to latchably secure the plug guide to the panel independent of the host circuit board and the card edge connector.

18. The card edge connector assembly of claim 17, wherein the plug guide is configured to engage the panel such that the plug guide is movable relative to the panel in a direction perpendicular to the mating direction when the panel latching feature is latchably secured to the panel to locate the plug guide relative to the host circuit board independent of the panel.

19. The card edge connector assembly of claim 16, wherein the plug guide is a straddle mount plug guide configured to straddle the host circuit board for locating pluggable modules both above and below the host circuit board.

20. A card edge connector assembly comprising:
a panel having a panel opening, the panel having a front and a rear;
a host circuit board having an upper surface and a lower surface, the host circuit board having an edge between the upper surface and the lower surface, the host circuit board being located rearward of the rear of the panel with the edge aligned with the panel opening;
an upper card edge connector mounted to the upper surface of the host circuit board, the upper card edge connector having a housing defining a card slot configured to receive a corresponding pluggable module in a mating direction, the housing of the upper card edge connector holding contacts in the card slot to electrically connect to the pluggable module;
a lower card edge connector mounted to the lower surface of the host circuit board, the lower card edge connector having a housing defining a card slot configured to receive a corresponding pluggable module in the mating direction, the housing of the lower card edge connector holding contacts in the card slot to electrically connect to the pluggable module; and
a plug guide having a main body including a front and a rear, the main body including a first end wall, a second end wall opposite the first end wall, and a first side wall between the first and second end walls, the plug guide having an exterior being received in the panel opening of the panel such that the front of the plug guide is forward of the front of the panel and the rear of the plug guide is rearward of the rear of the panel, the plug guide including a panel latching feature configured to latchably secure the plug guide to the panel independent of the host circuit board and the upper and lower card edge connectors, the main body defining a cavity including an upper chamber and a lower chamber, the upper chamber configured to receive the pluggable module mated with the upper card edge connector, the lower chamber configured to receive the pluggable module mated with the lower card edge connector, the plug guide having a board slot at the rear receiving the edge of the host circuit board to locate the plug guide relative to the upper surface and the lower surface of the host circuit board to position the upper card edge connector in the upper chamber and to position the lower card edge connector in the lower chamber, the plug guide including alignment channels configured to receive alignment posts of the corresponding pluggable modules to guide mating of the pluggable modules with the corresponding upper and lower card edge connectors.

21. An electrical system comprising:
a card edge connector assembly including a plug guide having a main body including a first end wall, a second end wall opposite the first end wall, and a first side wall between the first and second end walls, the main body defining a cavity configured to receive a housing of a card edge connector, the plug guide having a first alignment channel between the cavity and the first end wall, the plug guide having a second alignment channel between the cavity and the second end wall, the plug guide having an exterior being received in a panel opening of a panel, the plug guide including a panel latching feature configured to latchably secure the plug guide to the panel independent of the host circuit board and the card edge connector; and
a pluggable module received in the cavity, the pluggable module having a module body holding a module circuit board, the pluggable module having first and second alignment posts extending forward of the module body, the first and second alignment posts extend forward of the module circuit board, wherein the first and second alignment posts are received in the first and second alignment channels prior to the module circuit board being received in a card slot of the card edge connector to guide mating of the pluggable module with the card edge connector.

22. The electrical system of claim 21, wherein the plug guide includes a panel locating feature configured to locate the plug guide relative to the panel.

23. The electrical system of claim 21, wherein the plug guide includes a panel locating feature having a rear facing stop surface configured to engage a front of the panel to locate the plug guide relative to the front of the panel, the panel latching feature configured to engage a rear of the panel to capture the panel between the panel latching feature and the panel locating feature.

24. The electrical system of claim 21, wherein the plug guide is configured to engage the panel such that the plug guide is movable relative to the panel in a direction perpendicular to a mating direction of the pluggable module with the card edge connector when the panel latching feature is latchably secured to the panel.

25. The electrical system of claim 21, wherein the plug guide is sized relative to the panel opening to be movable in the panel opening to locate the plug guide relative to the card edge connector.

26. The electrical system of claim 21, wherein the cavity of the plug guide includes an upper chamber and a lower chamber, the upper chamber receives the pluggable module, the lower chamber receives a lower pluggable module, the plug guide locates the pluggable module and the lower pluggable module relative to each other.

* * * * *